(12) United States Patent
Tsakalakos et al.

(10) Patent No.: US 7,850,941 B2
(45) Date of Patent: *Dec. 14, 2010

(54) NANOSTRUCTURE ARRAYS AND METHODS FOR FORMING SAME

(75) Inventors: Loucas Tsakalakos, Niskayuna, NY (US); Bastiaan A. Korevaar, Schenectady, NY (US); Joleyn E. Balch, Schaghticoke, NY (US); Jody A. Fronheiser, Selkirk, NY (US); Reed R. Corderman, Niskayuna, NY (US); Fred Sharifi, Niskayuna, NY (US); Vidya Ramaswamy, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 404 days.

This patent is subject to a terminal disclaimer.

(21) Appl. No.: 11/551,305

(22) Filed: Oct. 20, 2006

(65) Prior Publication Data

US 2008/0093698 A1    Apr. 24, 2008

(51) Int. Cl.
*C01B 31/00* (2006.01)
*C01B 31/02* (2006.01)

(52) U.S. Cl. .................. 423/445 R; 977/891; 977/890; 977/888; 977/893; 423/447.3

(58) Field of Classification Search .................. 977/888, 977/890, 891, 893, 721, 742, 762; 423/445 R, 423/447.3

See application file for complete search history.

(56) References Cited

U.S. PATENT DOCUMENTS 6,231,744 B1    5/2001  Ying et al. .................. 205/324
6,359,288 B1    3/2002  Ying et al. .................. 257/14
6,709,929 B2    3/2004  Zhang et al. ............... 438/268
7,005,264 B2    2/2006  Su et al. ........................ 435/6
7,115,305 B2 *  10/2006 Bronikowski et al. .... 427/249.1
2003/0185985 A1 * 10/2003 Bronikowski et al. ....... 427/258

(Continued)

FOREIGN PATENT DOCUMENTS

| EP | 0 913 850 | 5/1999 |
| WO | WO 03/046265 | 6/2003 |
| WO | WO 2006/003620 | 1/2006 |
| WO | WO 2006/035325 | 4/2006 |
| WO | WO 2006/046178 | 5/2006 |

OTHER PUBLICATIONS

"Highly ordered two-dimensional carbon nanotube arrays" published in Applied Physics Letters, vol. 75, No. 14, (1999) 2047-2049 by Suh et al.*

(Continued)

*Primary Examiner*—Jennifer K Michener
*Assistant Examiner*—Heng M Chan
(74) *Attorney, Agent, or Firm*—Paul J. DiConza (57) ABSTRACT

A method for forming an array of elongated nanostructures, includes in one embodiment, providing a substrate, providing a template having a plurality of pores on the substrate, and removing portions of the substrate under the plurality of pores of the template to form a plurality of cavities. A catalyst is provided in the plurality of cavities in the substrate, and the pores of the template are widened to expose the substrate around the catalyst so that the catalyst is spaced from the sides of the plurality of pores of the template. A plurality of elongated nanostructures is grown from the catalyst spaced from the sides of the pores of the template.

19 Claims, 9 Drawing Sheets

U.S. PATENT DOCUMENTS

| | | | |
|---|---|---|---|
| 2004/0127012 A1 | 7/2004 | Jin | 438/618 |
| 2004/0150311 A1 | 8/2004 | Jin | 313/309 |
| 2004/0161949 A1 | 8/2004 | Yadav et al. | 438/800 |
| 2005/0062033 A1 | 3/2005 | Ichihara et al. | 257/17 |
| 2005/0116214 A1 | 6/2005 | Mammana et al. | 257/10 |
| 2005/0156180 A1 | 7/2005 | Zhang et al. | 257/79 |
| 2005/0206314 A1 | 9/2005 | Habib et al. | 313/542 |
| 2005/0276743 A1 | 12/2005 | Lacombe et al. | 423/447.3 |

OTHER PUBLICATIONS

Lee et al., "Uniform Field Emission From Aligned Carbon Nanotubes Prepared by CO Disproportionation," Journal of Applied Physics, v92n12, pp. 7519-7522, Dec. 15, 2002.

Lee et al., "Well-Ordered Co Nanowire Arrays for Aligned Carobon Nanotube Arrays," Synthetic Metals, v124, pp. 307-310, 2001.

Tsakalakos, et al., pending U.S. Appl. No. 11/551,308, filed Oct. 20, 2006 entitled "Nanostructure Arrays and Methods for Forming Same".

* cited by examiner fig. 1 fig. 2 fig. 3 fig. 4 fig. 5 fig. 6 fig. 7 fig. 8 fig. 9 fig. 10 fig. 16 fig. 17 fig. 18 fig. 19 fig. 20 fig. 21 fig. 22 fig. 23 fig. 24

NANOSTRUCTURE ARRAYS AND METHODS FOR FORMING SAME

CROSS-REFERENCE TO RELATED APPLICATION

This application is related to U.S. patent application Ser. No. 11/551,308, entitled "Nanostructure Arrays And Methods For Forming Same" filed concurrently herewith, the entire subject matter of which is incorporated herein by reference.

FIELD OF THE INVENTION

This invention relates to nanostructures, and in particular, to methods for forming nanostructure arrays such as nanowire arrays.

BACKGROUND OF THE INVENTION

Conventionally, nanowire arrays are grown on crystalline substrates with an epitaxial relationship such that the crystalline nanowires are generally vertically aligned due to the homo-epitaxy or hetero-epitaxy, or in some cases at angles with respect to the substrate.

A common technique for creating nanowire arrays is by a vapor-liquid-solid (VLS) synthesis process. This process uses as source material such as a feed vapor gas such as silane. The silane is then exposed to a catalyst such as liquid metal nanoparticles (e.g., gold), which are deposited on a substrate by evaporation or sputtering. The silane decomposes and dissolves into the nanoparticle, and when the silane reaches supersaturation in the metal, it precipitates out as a single crystal silicon wire. Templates having pores, such as an anodic aluminum oxide (AAO) templates, have been formed on the substrates to arrange and align the growth of the nanowires. Where the substrate is glass, a metal layer is typically disposed between the glass and the AAO template. However, a problem with the above technique is that upon exiting the AAO the wire is free to expand, plausibly causing catalyst transport on top of the template that can lead to secondary growth of nanowires from the surface of the AAO template or the merging of catalyst nanoparticles or droplets.

Lee et al., "Well-Ordered Co Nanowire Arrays For Aligned Carbon Nanotube Arrays", Synthetic Metals, Volume 124, Number 2, 22 Oct. 2001, pp. 307-310, discloses a process of forming carbon nanotube arrays which includes an anodization process to form a plurality of pores in an AAO film, overdepositing cobalt catalyst in the pores, polishing the surface, and etching back the cobalt.

Lee et al., "Uniform Field Emission From Aligned Carbon Nanotubes Prepared By CO Disproportionation", Journal of Applied Physics, Volume 92, Number 12, 15 Dec. 2002, pp. 7519-7522, discloses a process of forming carbon nanotube arrays which includes an anodization process to form a plurality of pores in a bulk AAO film, overdepositing cobalt catalyst near the mouth of the pores, and then a two step process one to etch back the overfilled cobalt catalyst and the other to widen the pores above the cobalt.

There is a need for further methods for forming nanostructures, and in particular, to methods for forming nanostructure arrays such as nanowire arrays.

SUMMARY OF THE INVENTION

The present invention, in a first aspect, provides a method for forming an array of elongated nanostructures. The method includes providing a substrate, providing a template having a plurality of pores on the substrate, removing portions of the substrate under the plurality of pores of the template to form a plurality of cavities in the substrate, providing a catalyst in the plurality of cavities in the substrate, widening the pores of the template to expose a portion of the substrate around the catalyst so that the catalyst is spaced from the sides of the plurality of pores of the template, and growing a plurality of elongated nanostructures from the catalyst spaced from the sides of the pores of the template.

The present invention, in a second aspect, provides a nanostructure array in which the array includes a template having a plurality of pores on a substrate, portions of the substrate under the plurality of pores of the template defining a plurality of cavities in the substrate having a cross-section sized smaller than the cross-section of the pores so that a portion of the substrate is exposed around the cavities and the plurality of cavities are spaced from the sides of the plurality of pores of the template, and a plurality of nanostructures extending from the cavities in the substrate and spaced from the sides of the pores of the template.

BRIEF DESCRIPTION OF THE DRAWINGS

The present matter which is regarded as the invention is particularly pointed out and distinctly claimed in the concluding portion of the specification. The present invention, however, may best be understood by reference to the following detailed description of various embodiments and the accompanying drawings in which:

DETAILED DESCRIPTION OF THE INVENTION

The present invention provides methods, for example, for improving the growth of nanostructure arrays such as nanowire arrays by chemical vapor deposition (CVD) using nanotemplates on a substrate. In templating a nanostructure array, if the template for growing the nanostructures is controlled it may be possible to increase the density of the nanostructures templated, and increase the uniformity of the nanostructures array. The present invention may also reduce the problem of catalyst transport on top of the nanotemplate that can lead to secondary growth from the nanotemplate surface, or merging of catalyst droplets. The present invention has applications in making, for example, nanostructure-based solar cells, detectors, field emission displays, X-ray sources, and other devices.

One embodiment of a method for forming nanostructure arrays in accordance with the present invention is illustrated in connection with reference to FIGS. 1-6. For example, with reference to FIG. 1, the process begins by providing a substrate 10, and providing a nanotemplate 30 having a plurality of pores 32 on substrate 10. Substrate 10 may be a single layer or a plurality of layers. For example, the layers may include a conductive layer, a semiconductive layer, a dielectric layer, or other types of layers and combinations thereof. In this illustrated embodiment, the top layer may be a conductive layer 20 such as tantalum nitride (Ta2N), zinc oxide (ZnO), tungsten (W), cobalt (Co), polycrystalline silicon (Si) or germanium (Ge), etc. The bottom layer 22 may be glass, silicon, metal foil, etc. The nanotemplate may be an anodized aluminum oxide (AAO) nanotemplate.

For example, the conductive layer may be formed or deposited on the substrate. The AAO nanotemplate may be formed by an electrochemical process such as deposition or evaporation of an aluminum thin film onto the conductive layer, placing the aluminum thin film into an electrochemical bath, and applying an electrical potential. The anodization process that occurs leads to the formation of nanopores extending downwardly into the thin film. The size, depth, pitch or distance between pores, is dependent on the electrical potential, current, type of solution, and concentration of the solution. The median pore size of the nanotemplate may include a diameter of about 1 nanometer to about 1,000 nanometers, and desirably about 10 nanometers to about 200 nanometers for most applications. The thickness of the AAO layer may be about 0.1 micron to about 50 microns, and desirably about 0.5 microns to about 5 microns. Another option is to utilize a commercially available 25 microns to 100 microns thick AAO film such as that formed by a two-step process involving a first process of forming the pores, and a second step of removing or etching the top of the formed layer where the pores are more random, thereby leaving the bottom portion having the more uniformly distributed pores.

Figure 1:
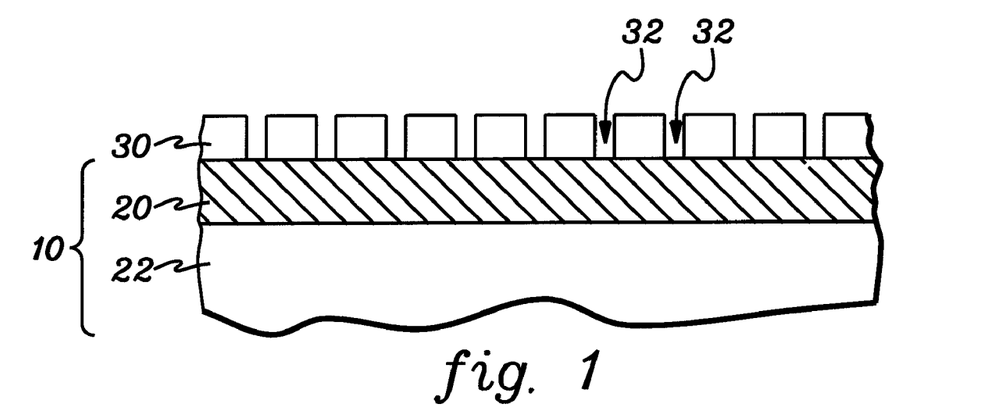
FIGS. 1-6 are diagrammatic illustrations of one embodiment of a method for forming a nanostructure array in accordance with the present invention.
Figure 2:
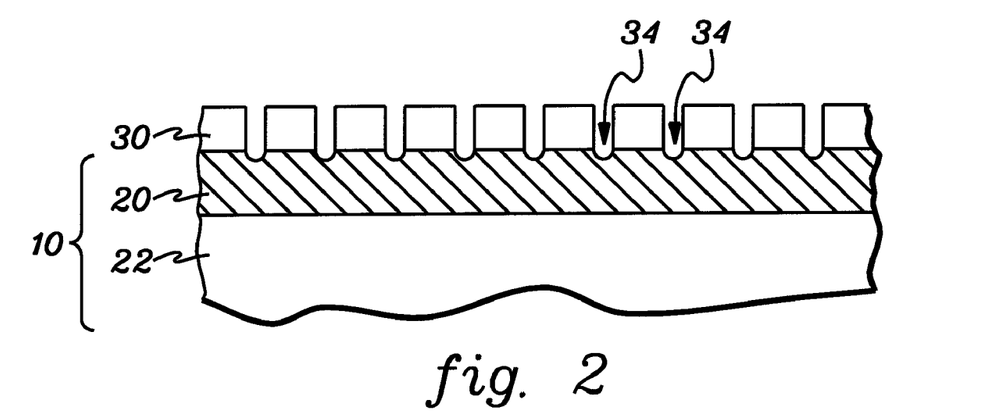

Thereafter, portions of conductive layer 20 under the plurality of pores of nanotemplate 30 are removed, as shown in FIG. 2, such as by etching down partially into the conductive layer with a dry etch or wet etch to form a plurality of generally uniform cavities 34. For example, a dry etching process may be performed in a reactive ion etcher where reactive gases are introduced into a plasma for etching the exposed portions of the conductive layer in the pores. A wet etching process may be performed wherein a solution etches or dissolves exposed portions of the conductive layer in the pores. Another option includes using an electrochemical bath for electrically driving the etching to remove portions of the conductive layer in the pores. The resulting cavities may have a generally uniform concave configuration. The depth of the cavity may be between about 1 nanometer and about 100 nanometers, and preferably about a depth equal to half to the full diameter of the pore nanometers. The depth of the cavity in the conductive layer may also extend to the substrate. The thickness of the conductive layer may be about 5 nanometers to about 1,000 nanometers, and preferably about 100 to about 500 nanometers. A step before the etching may include removing a barrier layer, for example, a thin aluminum oxide layer from the bottom of the pores.

Figure 3:
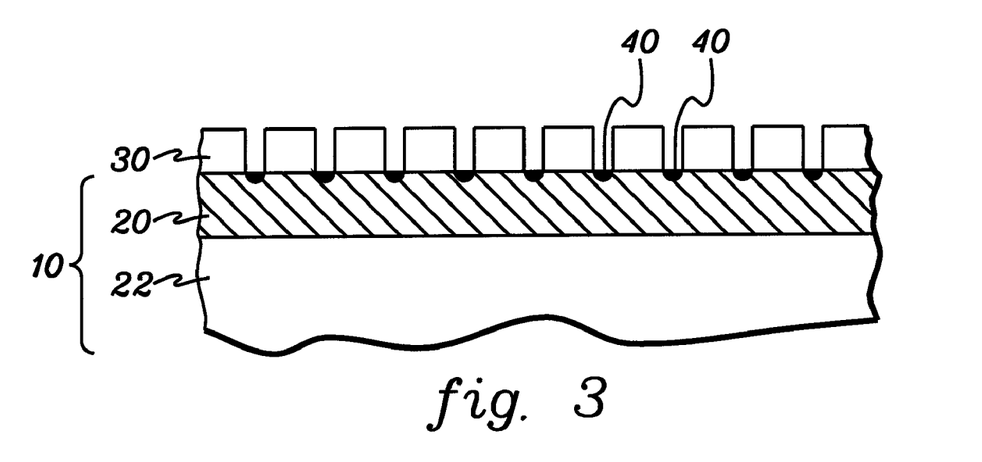
Figure 4:
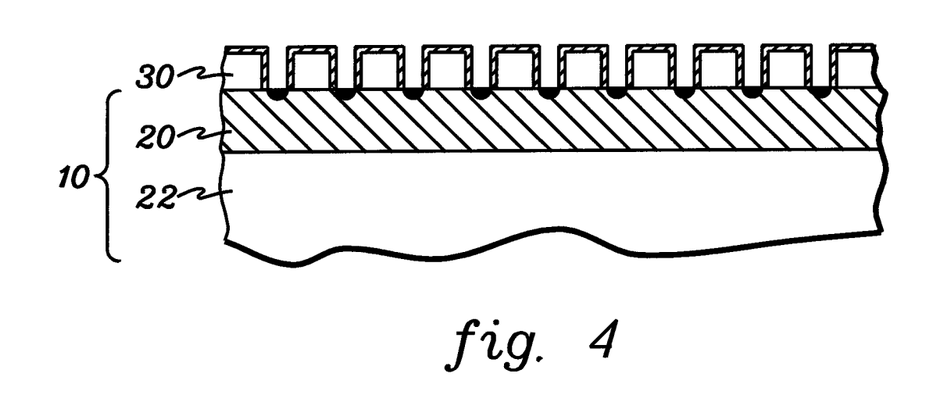

A metal catalyst 40, such as gold (Au), iron (Fe), indium (In), etc. may be electrochemically deposited into cavities 34 of conductive layer 20 as shown in FIG. 3. At room temperature the metal catalyst forms a solid. Desirably, the metal catalyst is disposed below the bottom of the nanotemplate and generally spaced from the sides of the pores of the nanotemplate. For example, the concave configuration of the cavity results in a reduced amount of metal catalyst being disposed adjacent to the sides of the pores in the nanotemplate. Other options for providing the metal catalyst in the cavities include electrodeless deposition, critical point deposition, evaporation, sputtering, and deposition of nanoparticles from solution directly or by a dielectrophoretic process.

Figure 5:
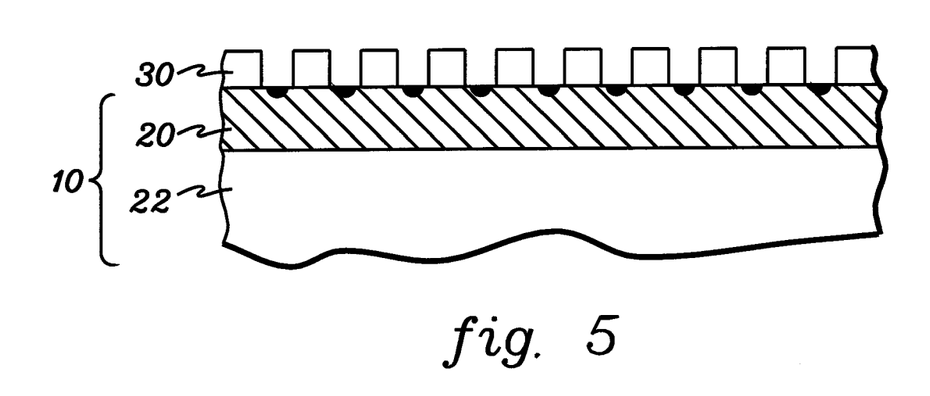

The plurality of pores in the nanotemplate is then widened. For example, a phosphoric acid wet etching process may be used to remove a portion of the nanotemplate shown with cross-hatching in FIG. 4, thereby exposing the conductive layer around the solid metal catalyst and leaving the solid metal catalyst disposed in the center of pore and spaced-apart from the sides of the pores as shown in FIG. 5. The median diameter of the pores of the nanotemplate may be increased from about 10-percent to about 20-percent in size.

Figure 6:
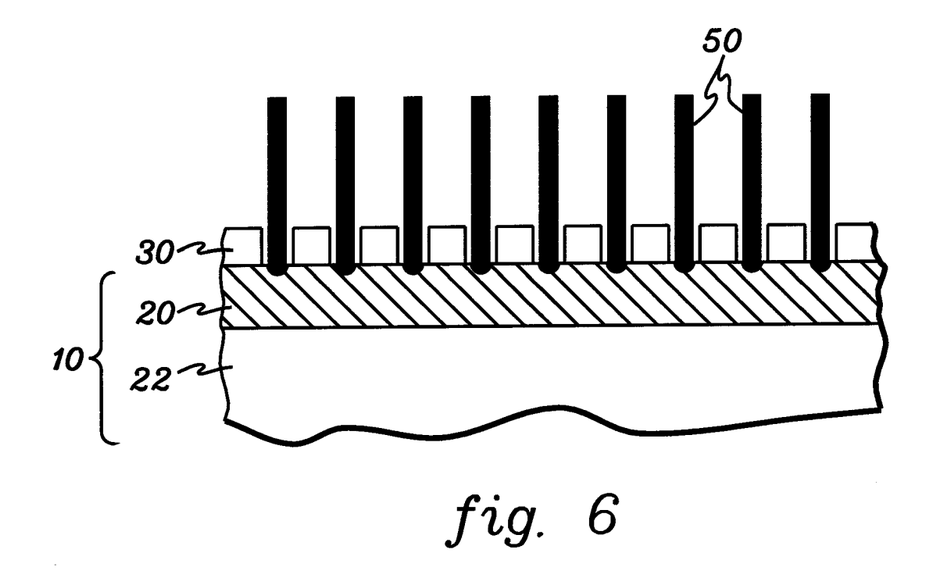

As shown FIG. 6, a plurality of nanostructures 50 is then grown, for example in a chemical vapor deposition (CVD) reaction chamber or tube. The metal catalyst during the growth process is heated and becomes a liquid and may be held in place by surface tension in the cavity and spaced from the sides of the pores in the nanotemplate. For example, a vapor-liquid-solid (VLS) synthesis process may be employed using a source material such as a feed vapor gas such as silane which is exposed to the metal catalyst. The silane decomposes and dissolves into the metal catalyst, and when the silane reaches supersaturation in the metal, it precipitates out as a single crystal silicon wire. Other precursor gases are utilized which are specific to the nanowire material of interest. For example, in the case of gallium arsenide (GaAs) nanowires, trimethylgallium and arsene are the precursors. The length of the nanostructures may be about 0.5 micron to about 50 microns and up to about 200 microns depending on the amount of time employed. For example, the nanostructures may reside within the pores of the nanotemplate or may extend from the surface of the nanotemplate. Further, from the present description, it may be possible to provide the substrate with nanotemplates on both sides of the substrate so that nanostructures may be grown on top and on the bottom.

Figure 7:
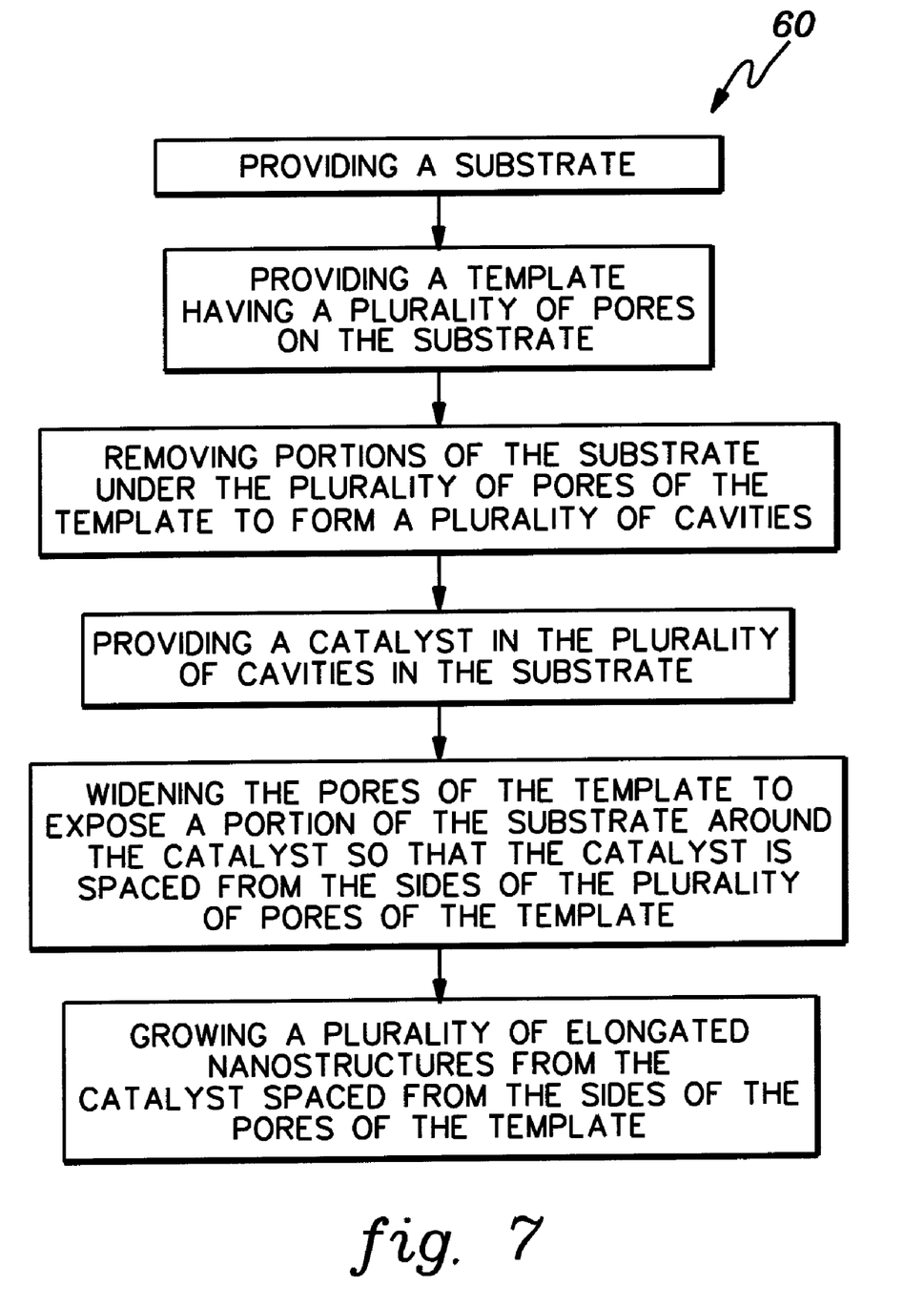
FIG. 7 is a flowchart describing the steps of the method shown in FIGS. 1-6.

FIG. 7 illustrates a flowchart describing the steps of process 60 for forming nanostructure arrays in accordance with the method shown in FIGS. 1-6.

The present invention inhibits the likelihood of secondary growth from the surface of the nanotemplate surface such as due to the catalyst expanding and diffusing onto the surface of the nanotemplate, and maintaining the nanostructures in a vertical orientation and inhibiting the merging of catalyst droplets.

Figure 8:
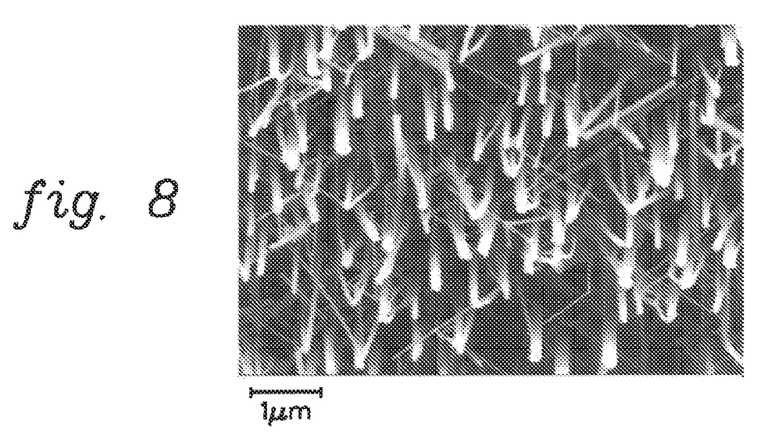
FIGS. 8 and 9 are images of a nanostructure array formed on a silicon substrate using the method of FIGS. 1-7.
Figure 9:
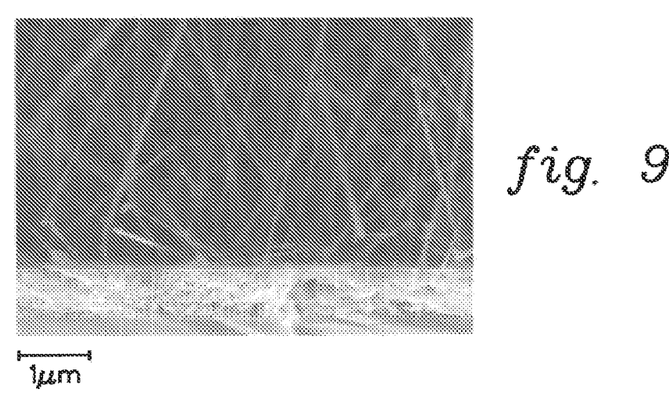
Figure 10:
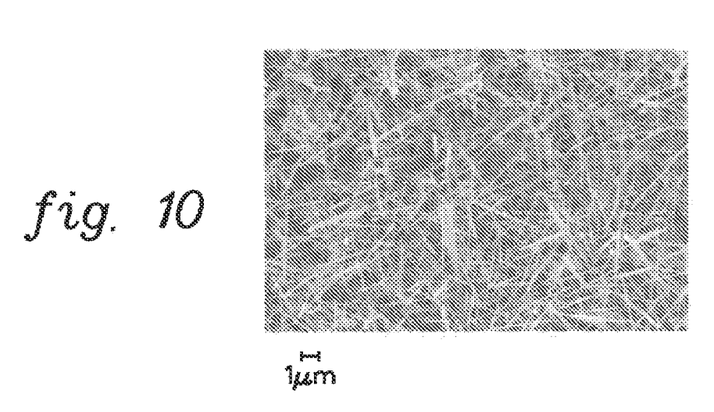
FIG. 10 is an image of a nanostructure array formed on a glass substrate using the method of FIGS. 1-7.

FIGS. 8 and 9 illustrate images of uniformly sized and generally aligned silicon nanowires grown using electrodeposited gold (Au) catalyst in an AAO nanotemplate on a silicon substrate with pore widening, as described above. FIG. 10 illustrates an image of uniformly sized and generally aligned silicon nanowires grown using electrodeposited catalyst in an AAO nanotemplate on a glass substrate with pore widening, as described above.

From the present description, it will be appreciated that after forming the plurality of cavities in the substrate, instead of pore widening, the nanotemplate such as the entire nanotemplate may be removed and the plurality of nanostructures grown from the substrate as described above.

FIGS. 11-15 illustrate another embodiment of a method for forming nanostructure arrays in accordance with the present invention which includes a two-step anodization process, such that at the bottom of the nanotemplate the pore size is smaller than at the top. This creates a cavity directly without the need to form or etch a plurality of cavities into a conductive layer.

Figures 11, 12, 13, 14:
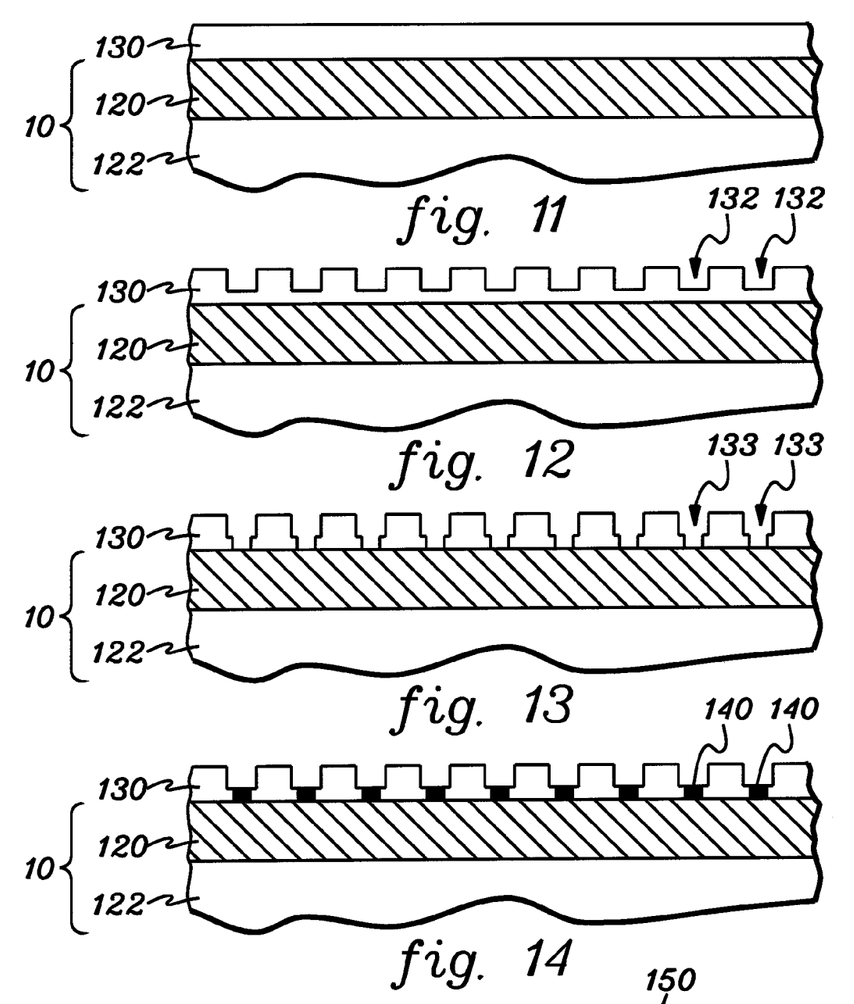
FIGS. 11-15 are diagrammatic illustrations of another embodiment of a method for forming a nanostructure array in accordance with the present invention.

Initially, as shown in FIG. 11, the method includes providing a substrate 110 which may include a bottom layer 122 such as glass, metal foil, ceramic such as aluminum oxide, or silicon (Si) and a top conductive layer 120, and a thin film layer 130 such as an aluminum thin film on conductive layer 120. Thereafter, the aluminum may be placed in an electrochemical bath, and a first anodization process performed. This first anodization process results in the formation of large sized nanopores 132 extending downwardly into the thin film as shown in FIG. 12. A second anodization process may then be performed which results in the formation of smaller sized pores 133 extending downwardly from large sized pores 132 to conductive layer 120 as shown in FIG. 13. It will be appreciated by those skilled in the art that various parameters affecting the anodization process such as the electrical potential, the current, the solution, and the concentration of the solution, may be suitably selected to result in the configuration of the pores having a stepped configuration. In addition, the process of forming the plurality of pores may be performed in a single step by varying the various parameters during the pore formation process.

A metal catalyst 140, such as gold (Au), iron (Fe), indium (In), etc. may be electrochemically deposited on conductive layer 120 in the smaller sized pores 133, as shown in FIG. 14. Other options for providing the metal catalyst in the pores may include electrodeless deposition, critical point deposition, evaporation, sputtering, and deposition of nanoparticles from solution directly or by a dielectrophoretic process.

Figure 15:
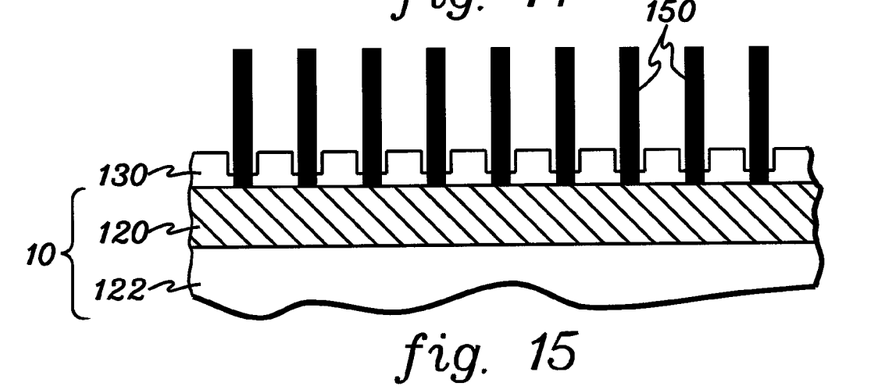

As shown in FIG. 15, a plurality of nanostructures 150 is then grown, for example in a chemical vapor deposition (CVD) reaction chamber or tube, as described above, wherein the growth of the nanostructure is away from the sides of the upper portion of the pores.

Figure 16:
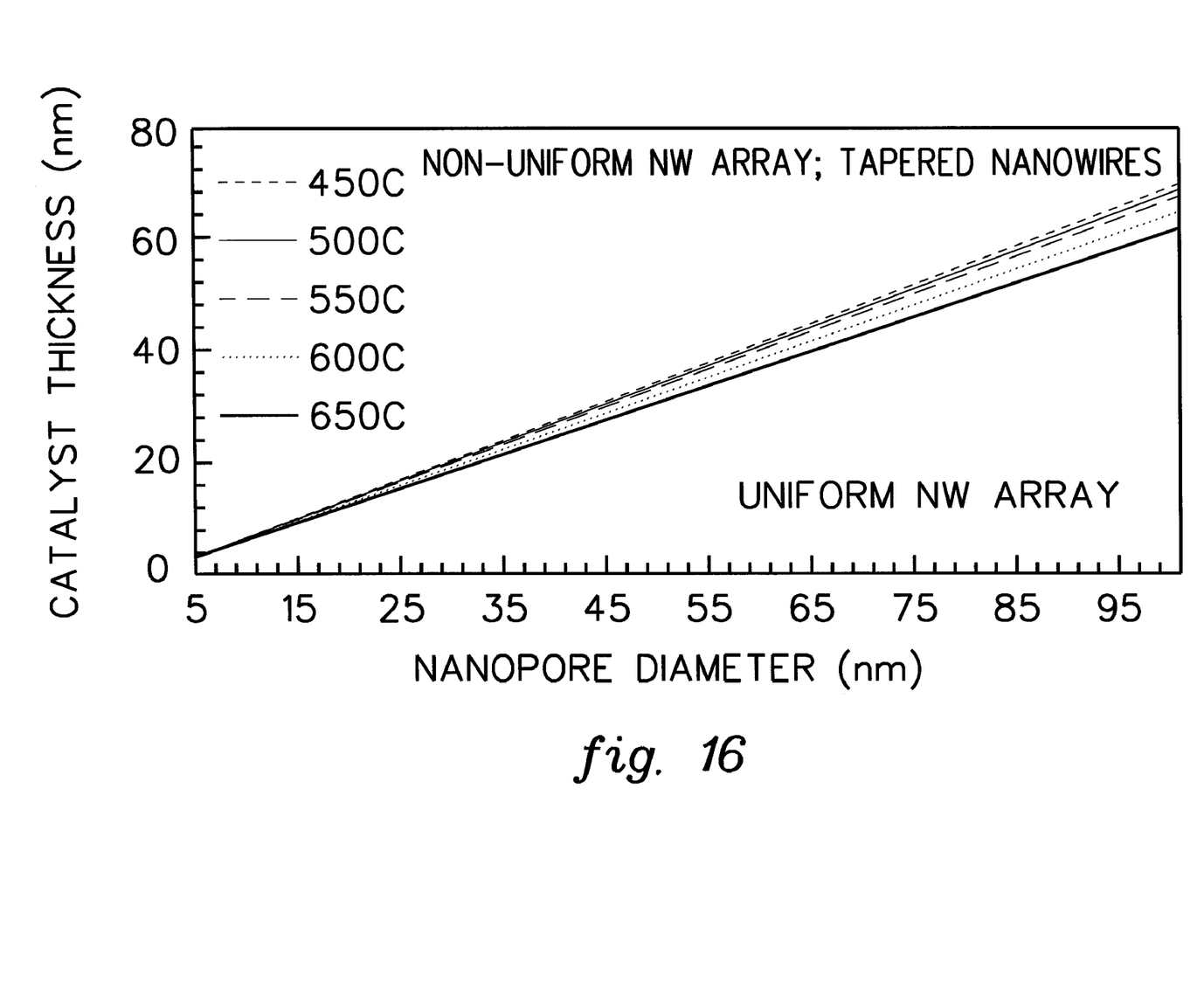
FIG. 16 is a graph illustrating catalyst thickness as a function of median pore diameter for various temperatures and which may be used to determine whether the resulting nanostructure is uniform or non-uniform.

FIG. 16 illustrates a graph of the catalyst thickness required to ensure that the catalyst does not expand upon emanating from the nanotemplate surface as a function of the pore diameter for various temperatures where the pore diameter of the catalyst is equal to the diameter of the pore. Thus, in another aspect of the present invention, selecting the catalyst thickness, diameter, and temperature may eliminate the need to widen the pores of the nanotemplate while still reducing the likelihood of the growth of non-uniform and non-aligned nanostructures. In addition, selecting the catalyst thickness, diameter, and temperature along with incorporating the pore widening processes of the present invention may also further reduces the likelihood of the growth of non-uniform nanostructures.

Figure 17:
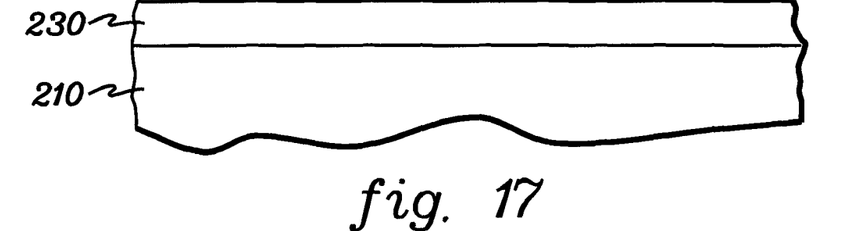
FIGS. 17-20 illustrate another embodiment of a method for forming a nanostructure array in accordance with the present invention.
Figure 18:
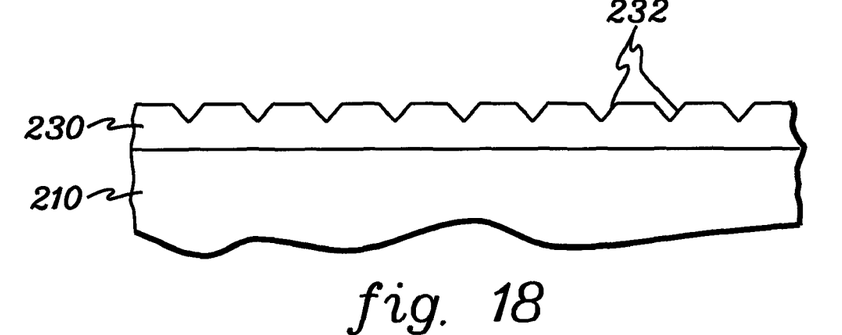

FIGS. 17-20 illustrate another embodiment of a method for forming nanostructure arrays in accordance with the present invention which includes a varying anodization process to provide nanotemplates having varying sized pores. Initially, as shown in FIG. 17 the method includes providing a substrate 210 such as glass, metal foil, ceramic such as aluminum oxide, or silicon (Si), a member or thin film layer 230 such as a solid aluminum thin film disposed on the substrate. Thereafter, the aluminum may be placed in an electrochemical bath, and a varying anodization process performed. This anodization process may result in the formation generally conical shaped pores 232 extending downwardly into the thin film as shown in FIG. 18. It will be appreciated by those skilled in the art that the various parameters affecting the anodization process such as the electrical potential, the current, the solution, and the concentration of the solution, may be suitably controlled to result in the configuration of the pores having a conical configuration.

Figure 19:
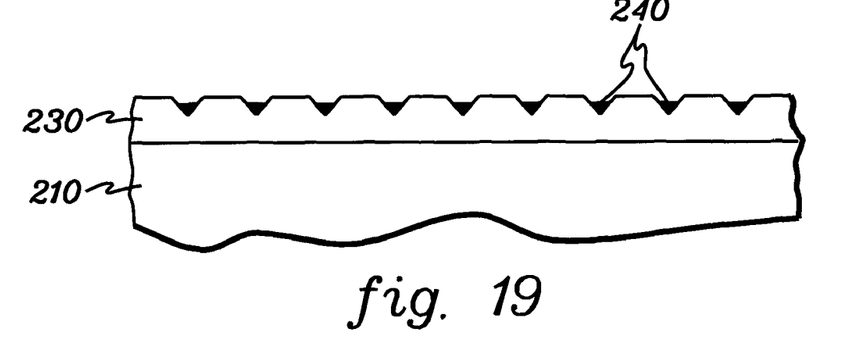

A metal catalyst 240, such as gold (Au), iron (Fe), indium (In), etc. may be electrochemically introduced or deposited into the bottom of the pores which form a solid at room temperature having a generally uniform configuration, as shown in FIG. 19.

Figure 20:
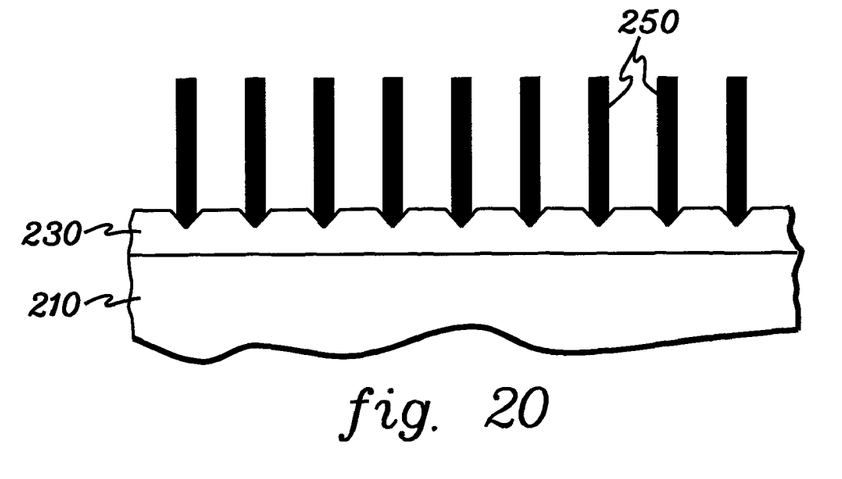

As shown in FIG. 20, a plurality of generally uniform nanostructures 250 is then grown, for example in a chemical vapor deposition (CVD) reaction chamber or tube, as described above, or a metal organic chemical vapor deposition (MQCVD) reactor, wherein the growth of the nanostructure is away from the sides of the upper portion of the pore.

With reference again to FIG. 16, it is possible to configure the angle of the side of the conical pores based on the temperature of forming the nanostructures, the diameter of the catalyst, and the thickness of the catalyst so as to increase the likelihood of uniform nanostructures.

Figure 21:
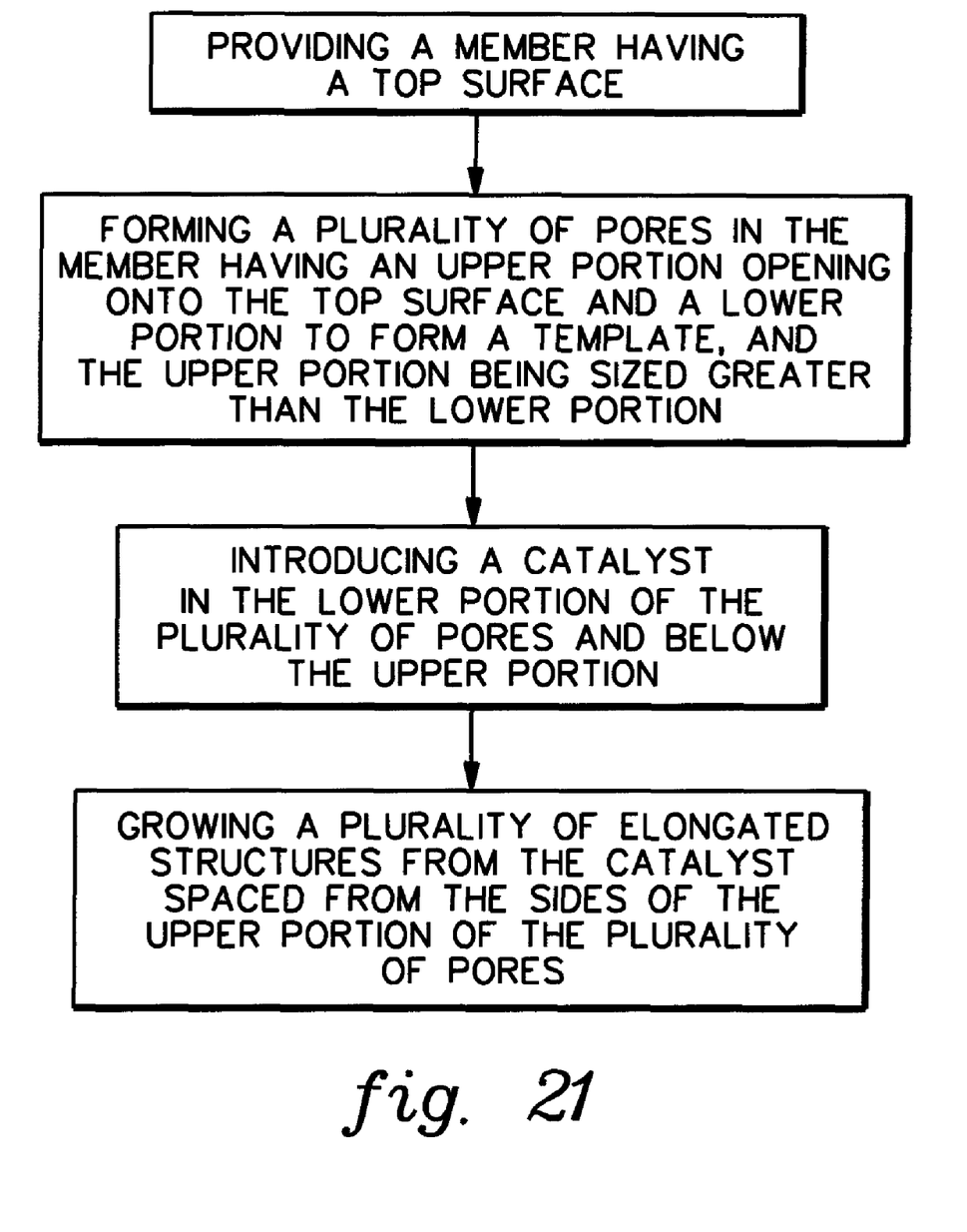
FIG. 21 is a flowchart describing the steps of the method for forming nanostructure arrays shown in FIGS. 11-15 and 17-20.

FIG. 21 illustrates a flowchart describing the steps of a process 300 for forming nanostructure arrays in accordance the method shown in FIGS. 11-15 and 17-20.

Figure 22:
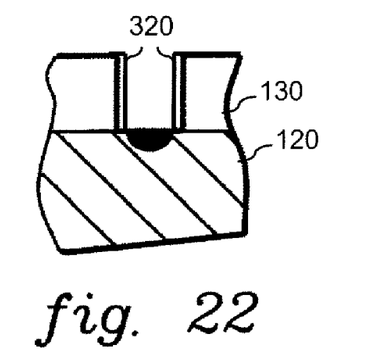
FIGS. 22-24 are cross-sectional views of various nanotemplate pores having a coating prior to growing the nanostructure.
Figure 23:
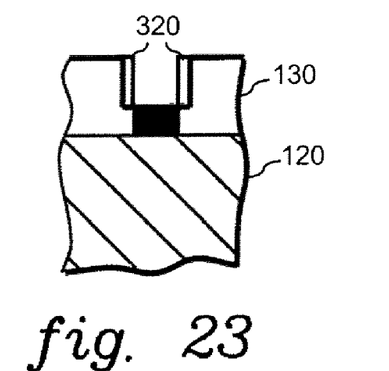
Figure 24:
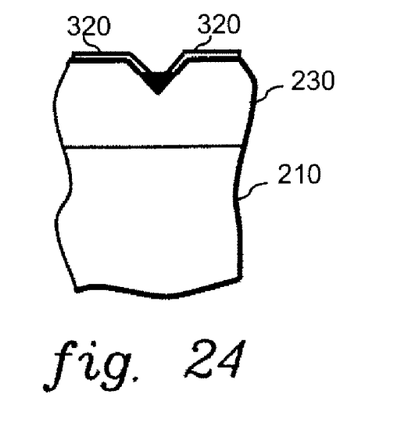

In addition, as shown in FIGS. 22-24, high-density arrays without secondary growth may be further achieved by suitably placing a conductive or non-conductive coating 320 on the sidewalls of the pores such that the liquid catalyst does not wet the sidewall as it rises in the pores. The coating may be applied to the inside of the various configurations of the pores described above. Further, such a coating may be placed on the top of the nanotemplate to limit diffusion of the catalyst and/or create a reaction such that wires cannot grow on the top surface. From the present description, it will be appreciated by those skilled in the art that the coating on the inside of the pores and/or on top of the nanotemplate may allow for high-density arrays without secondary growth where the pores have a constant cross-section and the nanostructure is grown up against the coating in the pores. For example, while applying the coating, the nanotemplate may be angled or tilted to only coat the sides of the pores and not the catalyst. An example, of a coating may be a thin titanium layer. Other examples of coatings include tantalum (Ta), niobium (Nb), and tungsten (W).

The above-described processes may result in the formation of nanowires. It will also be appreciated from the above discussion that the present invention may also be employed to produce nanostructure arrays having a plurality of nanotubes using suitable gasses, catalyst metal, and CVD process. Such nanotubes may be formed from carbon or an inorganic material.

The various methods of the present invention can also be applied to other templates, including block-copolymer fabricated SiO2 or SiN, electron-beam lithography formed templates, etc. The pitch of the pores may also be important in controlling interaction between wires at the top of the membrane or for certain properties of interest. The order of the pores in the plane may also be important. The invention applies to pores that are well ordered as well as pores that are randomly ordered, and configuration with medium long-range order.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for forming an array of elongated nanostructures, the method comprising:
   providing a substrate;
   providing a template on the substrate having a plurality of pores;
   removing portions of the substrate under the plurality of pores of the template to form a plurality of cavities in the substrate;
   providing a catalyst in the plurality of cavities in the substrate so that an upper surface of the catalyst lies below the bottom surface of the template;
   widening the pores of the template to expose a portion of the substrate around the catalyst so that the catalyst is spaced from the sides of the plurality of pores of the template; and
   growing a plurality of elongated nanostructures from the catalyst spaced from the sides of the pores of the template.

2. The method of claim 1 wherein the growing comprises growing the plurality of nanostructures having a generally aligned configuration.

3. The method of claim 2 wherein the providing a template comprises providing the plurality of pores having a generally uniform configuration, and wherein the growing comprises growing the plurality of nanostructures having a generally uniform cross-section.

4. The method of claim 1 wherein the removing portions of the substrate comprises removing portions of the substrate under the plurality of pores to form a plurality of concave cavities in the substrate.

5. The method of claim 1 wherein the providing the substrate comprises providing a conductive layer.

6. The method of claim 1 wherein the widening of the pores comprises widening the pores of the template so that the catalyst is entirely spaced from the sides of the plurality of pores.

7. The method of claim 1 wherein the providing the catalyst comprises providing the catalyst having a thickness based on a median pore diameter of the plurality of the pores and a temperature used to grow the nanostructures so that the catalyst does not expand upon emanating from the template surface.

8. The method of claim 1 further comprising at least one of a) coating the sides of the plurality of pores to inhibit diffusion of the catalyst onto the sides of the pores of the template, and b) coating a top surface of the template to inhibit at least one of diffusion of the catalyst onto the top surface of the template and reaction at the top surface.

9. The method of claim 1 wherein the growing of the plurality of elongated nanostructures comprises at least one of a) growing a plurality of nanowires, and b) growing a plurality of nanotubes.

10. The method of claim 1 wherein the growing of the plurality of elongated nanostructures comprises growing a plurality of nanowires comprising silicon.

11. A method for forming an array of nanowires, the method comprising:
    providing a substrate comprising a top conductive layer and a bottom layer;
    providing a template having a plurality of pores on the top conductive layer;
    removing portions of the top conductive layer under the plurality of pores of the template to form a plurality of cavities in the top conductive layer;
    providing a catalyst in the plurality of cavities in the top conductive layer so that an upper surface of the catalyst lies below the bottom surface of the template;
    widening the pores of the template to expose a portion of the top conductive layer around the catalyst so that the catalyst is spaced from the sides of the plurality of pores of the template; and
    growing a plurality of nanowires from the catalyst spaced from the sides of the pores of the template, the plurality of nanowires having a generally uniform cross-section and a generally aligned configuration.

12. A nanostructure array comprising:
    a template having a plurality of pores on a substrate;
    portions of the substrate under the plurality of pores of the template defining a plurality of cavities in the substrate having a cross-section sized smaller than the cross-section of the pores so that a portion of the substrate is exposed around the cavities and the plurality of cavities is spaced from the sides of the plurality of pores of the template; and
    a plurality of nanostructures extending from the cavities in the substrate and spaced from the sides of the pores of the template, wherein the plurality of nanostructures has a generally uniform cross-section achieved by growing the nanostructures from a catalyst within the plurality of cavities so that an upper surface of the catalyst lies below the bottom surface of the template and at a temperature so that the catalyst does not expand upon emanating from the template surface.

13. The array of claim 12 wherein the plurality of nano structures has a generally aligned configuration.

14. The array of claim 12 wherein the plurality of cavities comprises a plurality of concave cavities.

15. The array of claim 12 wherein the substrate comprises a conductive layer.

16. The array of claim 12 further comprising at least one of a) a coating on the sides of the plurality of pores to inhibit diffusion of the catalyst onto the sides of the pores of the template, and b) a coating on a top surface of the template to inhibit at least one of diffusion of the catalyst onto the top surface of the template and reaction at the top surface.

17. The array of claim 12 wherein the plurality of nanostructures comprises at least one of a) a plurality of nanowires, and b) a plurality of nanotubes.

18. The array of claim 12 wherein the plurality of nanostructures comprises a plurality of nanowires comprising silicon.

19. A nanostructure array comprising:
    a template having a plurality of pores on a substrate having a top conductive layer and a bottom layer;
    portions of the top conductive layer under the plurality of pores of the template defining a plurality of cavities in the top conductive layer having a cross-section sized smaller than the cross-section of the pores so that a portion of the top conductive layer is exposed around the cavities and the plurality of cavities is spaced from the sides of the plurality of pores of the template; and
    a plurality of nanostructures extending from the cavities in the top conductive layer and spaced from the sides of the pores of the template and having a generally aligned configuration and uniform cross-section, wherein the plurality of nanostructures has a generally uniform cross-section achieved by growing the nanostructures from a catalyst within the plurality of cavities so that an upper surface of the catalyst lies below the bottom surface of the template and at a temperature so that the catalyst does not expand upon emanating from the template surface.

* * * * *

UNITED STATES PATENT AND TRADEMARK OFFICE
CERTIFICATE OF CORRECTION

PATENT NO. : 7,850,941 B2  Page 1 of 1
APPLICATION NO. : 11/551305
DATED : December 14, 2010
INVENTOR(S) : Tsakalakos et al.

It is certified that error appears in the above-identified patent and that said Letters Patent is hereby corrected as shown below:

In Fig. 21, Sheet 8 of 9, insert Lead Line -- 300 --, above the figure.

In Column 6, Line 13, delete "(MQCVD)" and insert -- (MOCVD) --, therefor.

Signed and Sealed this
Twelfth Day of April, 2011

David J. Kappos
*Director of the United States Patent and Trademark Office*